(12) United States Patent
Hao et al.

(10) Patent No.: US 8,269,897 B2
(45) Date of Patent: Sep. 18, 2012

(54) METHOD AND APPARATUS FOR VIDEO FORMAT CONVERSION

(75) Inventors: Jianbin Hao, San Jose, CA (US); Ning Zhu, San Jose, CA (US)

(73) Assignee: Analogix Semiconductor, Inc., Santa Clara, CA (US)

( * ) Notice: Subject to any disclaimer, the term of this patent is extended or adjusted under 35 U.S.C. 154(b) by 1134 days.

(21) Appl. No.: 11/869,600

(22) Filed: Oct. 9, 2007

(65) Prior Publication Data

US 2008/0174693 A1 Jul. 24, 2008

Related U.S. Application Data

(60) Provisional application No. 60/897,415, filed on Jan. 24, 2007.

(51) Int. Cl.
*H04N 9/67* (2006.01)

(52) U.S. Cl. ........ 348/659; 348/441; 348/445; 348/651; 348/660

(58) Field of Classification Search .................. 348/445, 348/441, 651, 659–660; 345/604
See application file for complete search history.

(56) References Cited

U.S. PATENT DOCUMENTS

| | | | |
|---|---|---|---|
| 5,473,381 A * | 12/1995 | Lee | 348/441 |
| 5,550,590 A | 8/1996 | Sakazawa et al. | |
| 5,638,533 A * | 6/1997 | Law | 711/157 |
| 6,038,256 A | 3/2000 | Linzer et al. | |
| 6,094,457 A | 7/2000 | Linzer et al. | |
| 6,118,300 A | 9/2000 | Wittig et al. | |
| 6,167,084 A | 12/2000 | Wang et al. | |
| 6,192,083 B1 | 2/2001 | Linzer et al. | |
| 6,259,733 B1 | 7/2001 | Kaye et al. | |
| 6,518,970 B1 * | 2/2003 | Glen et al. | 345/501 |
| 6,674,796 B1 | 1/2004 | Haskell et al. | |
| 7,034,860 B2 | 4/2006 | Lia et al. | |
| 2005/0128348 A1 | 6/2005 | Orfitelli | |
| 2005/0135486 A1 | 6/2005 | Lee | |
| 2005/0206784 A1 | 9/2005 | Li et al. | |
| 2006/0031889 A1 | 2/2006 | Bennett et al. | |
| 2006/0092324 A1 | 5/2006 | Morishige | |
| 2006/0176954 A1 | 8/2006 | Lu et al. | |

OTHER PUBLICATIONS

Joel F. Adam et al., "The Vidboard: a video capture and processing peripheral for a distributed multimedia system", Proceedings of the First ACM International Conference on Multimedia, 1993, pp. 113-120.
M. F. Cowlishaw, "Fundamental Requirements for Picture Presentation", Proceedings of the Society for Information Display, 1985, pp. 101-107, vol. 26, No. 2.
International Search Report and Written Opinion of the International Searching Authority Dated Jul. 4, 2008, International Application No. PCT/US2008/000056.

* cited by examiner

*Primary Examiner* — Kristine Kincaid
*Assistant Examiner* — Sumaiya A Chowdhury
(74) *Attorney, Agent, or Firm* — Blakely Sokoloff Taylor & Zafman LLP

(57) ABSTRACT

High-Definition Multimedia Interface Specification, Version 1.2, supports multiple video formats. Currently the HDMI sources and sinks support multiple formats through reconfiguration of the system. The present invention describes the use of a configurable 'n'×'n' data pixel mapping matrix for video format conversion. This mapping matrix allows the mapping of any existing video format to any other existing or future video format and allows flexibility of connectivity to any transmitter or receiver. Accordingly a more user friendly implementation that provides greater flexibility for development and use of new formats in video applications is shown.

2 Claims, 4 Drawing Sheets

| Input bits | Control bits | Output bits |
|---|---|---|
| Bit 0 – Red bit 1 | S0 =8 | Green bit 1 |
| Bit 1 – Red bit 2 | S1= 9 | Green bit 2 |
| Bit 2 – Red bit 3 | S2=10 | Green bit 3 |
| Bit 3 – Red bit 4 | S3=11 | Green bit 4 |
| Bit 4 – Red bit 5 | S4=12 | Green bit 5 |
| Bit 5 – Red bit 6 | S5=13 | Green bit 6 |
| Bit 6 – Red bit 7 | S6=14 | Green bit 7 |
| Bit 7 – Red bit 8 | S7=15 | Green bit 8 |
| Bit 8 – Green bit 1 | S8 = 16 | Blue bit 1 |
| Bit 9 – Green bit 2 | S9 = 17 | Blue bit 2 |
| Bit 10 – Green bit 3 | S10 = 18 | Blue bit 3 |
| Bit 11 – Green bit 4 | S11 = 19 | Blue bit 4 |
| Bit 12 – Green bit 5 | S12 = 20 | Blue bit 5 |
| Bit 13 – Green bit 6 | S13 = 21 | Blue bit 6 |
| Bit 14 – Green bit 7 | S14 = 22 | Blue bit 7 |
| Bit 15 – Green bit 8 | S15 = 23 | Blue bit 8 |
| Bit 16 – Blue bit 1 | S16 = 0 | Red bit 1 |
| Bit 17 – Blue bit 2 | S17 = 1 | Red bit 2 |
| Bit 18 – Blue bit 3 | S18 = 2 | Red bit 3 |
| Bit 19 – Blue bit 4 | S19 = 3 | Red bit 4 |
| Bit 20 – Blue bit 5 | S20 = 4 | Red bit 5 |
| Bit 21 – Blue bit 6 | S21 = 5 | Red bit 6 |
| Bit 22 – Blue bit 7 | S22 = 6 | Red bit 7 |
| Bit 23 – Blue bit 8 | S23 = 7 | Red bit 8 |

FIGURE 2

METHOD AND APPARATUS FOR VIDEO FORMAT CONVERSION

CROSS-REFERENCE TO RELATED APPLICATION

This application claims the benefit of U.S. Provisional Patent Application No. 60/897,415 filed Jan. 24, 2007.

BACKGROUND OF THE INVENTION

1. Field of the Invention

The present invention relates to the High Definition Multimedia Interface (HDMI), and specifically to the conversion between different formats of HDMI video signals.

2. Prior Art

There are many component video formats in use. The most commonly used component video formats are RGB, YPbPr and YCbCr. The RGB format is the basic format in which the signal is generated in the video camera. In other formats the Y component of this signal is the black and white information contained within the original RGB signal. The Pb and Pr signal are color difference signals, which are mathematically derived from the original RGB signal. It is important to realize that what is commonly called "component video" (YPbPr or YCbCr) output and RGB video output are not the same and are not directly compatible with each other, however, they can be converted either way.

Advanced Television Systems Committee (ATSC) is a committee which specifies the digital TV broadcasting system in use in the USA. This standard supports both standard definition (SD) and (HD) broadcasts. There are 18 approved formats for digital TV broadcasts covering both SD (640×480 and 704×480 at 24p, 30p, 60p, 60i) and HD (1280×720 at 24p, 20p, and 60p; 1920×1080 at 24p, 30p and 60i).

HDMI has the capacity to support existing high-definition video frame and display formats (720p, 1080i, and 1080p/60). It also has the flexibility to support enhanced definition video frame and display formats such as 480p, as well as standard definition formats such as NTSC or PAL.

Currently there are a number of Video formats, each with its own ordered data streams having a specific sequence. There has been no common mapping facility which can be easily implemented as part of an integrated circuit to map these sequences into other usable video data sequences.

BRIEF DESCRIPTION OF THE DRAWINGS

FIG. 2 is a tabular form of an exemplary mapping according to the disclosed invention.

DETAILED DESCRIPTION OF THE PREFERRED EMBODIMENTS

There are today a number of formats for Video signals and the list of formats is growing to accommodate larger screens and higher definitions. Disclosed is an n×n Video data pixel mapping matrix implemented as a n×n crossbar mapping matrix, for example as an integrated circuit (IC), that enables the mapping of any of the n-data inputs to any of the n-data outputs. This mapping matrix allows the mapping of any existing video formats to any other existing or future video format, and allows flexibility of connectivity to any transmitter or receiver. This solution enables the achieving of the necessary mapping of video data sequences in one video format into other video data sequences corresponding to other video formats, including mapping of older video formats to newer formats and vice versa.

This invention allows all of today's known formats to be mapped to alternate formats efficiently. Today typical video data does not exceed 36 bits. Next generation Video formats may require a 48×48 mapping matrix, or even a 64×64 mapping matrix. Such matrices implemented in accordance with the disclosed invention can be easily implemented using currently available IC manufacturing technology. Even though the current and immediate future requirements will be met by a mapping matrix of 48×48, it is expected that future formats will require further extensions of the mapping matrix. There is no limitation to the possible extension of the mapping matrix to meet the needs of the future formats as they arise.

The current implementation requirement of this mapping matrix is a 36 input to 36 output unit. This allows all of today's commonly used formats to be mapped to alternate formats efficiently (as long as the video data does not exceed 36 bits). Next generation Video formats will require a 48×48 mapping matrix or 64×64 mapping matrix. These and even larger matrices can easily be implemented as an extension of the current 36 to 36 mapping matrix.

Figure 1:
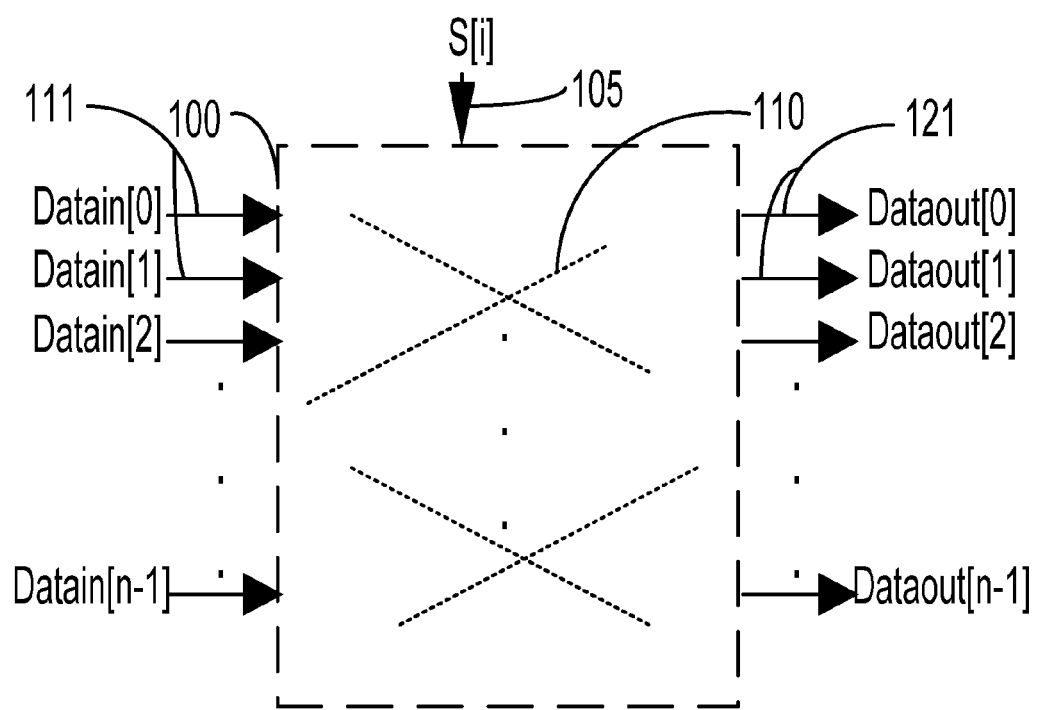
FIG. 1 is a conceptual diagram of a mapping matrix.

According to the disclosed invention, shown in FIG. 1, the mapping matrix is designed specifically for video data bit or pixel mapping. The mapping matrix has 'n' input signals 111 and 'n' output signals 121. Each of the 'n' input signals 111 may be mapped by the mapping matrix 100 to any one of the 'n' output signals 121. However, two input signals 111 cannot be mapped simultaneously to a single output signal 121. For an 'n' pixel input having bit (0) to bit (n−1), the invention is shown pictorially in FIG. 1 where the mapping matrix 100 with cross connects 110 is capable of interconnecting any one of the 'n' inputs 111 to any one, and only one, of the 'n' outputs 121 based on a specific and non-repeating select control or select signal value S[i] input 105 which is derived from a formatting signal. The formatting signal is decoded to produce the necessary control input values S[i] where [i] being integer values 0 to (n−1), associated with each input 111 of the 0 to (n−1) inputs of the mapping matrix 100. These control S[i] inputs 105 thus enables the necessary connection through the mapping matrix 100 to the output 121, each one input 111 of the 0 to (n−1) inputs connecting to one and only one of the 0 to (n−1) outputs 121 as designated by the control S[i] input 105.

The value of each output decided using this characteristic is as follows:

$$S_i = 0 : Dataout[i] \Leftarrow Datain[0] \quad (1)$$

$$S_i = 1 : Dataout[i] \Leftarrow Datain[1]$$

$$\vdots$$

$$Si = n - 1 : Dataout[i] \Leftarrow Datain[n-1]$$

where i=0, 1, . . . n−1

As a simple non-limiting example, a 24 to 24 conversion is shown. If the input video pixel is 24-bit RGB, the format is as follows:

Bit 0—Red bit 1
Bit 1—Red bit 2
Bit 2—Red bit 3

Bit 3—Red bit 4
Bit 4—Red bit 5
Bit 5—Red bit 6
Bit 6—Red bit 7
Bit 7—Red bit 8
Bit 8—Green bit 1
Bit 9—Green bit 2
Bit 10—Green bit 3
Bit 11—Green bit 4
Bit 12—Green bit 5
Bit 13—Green bit 6
Bit 14—Green bit 7
Bit 15—Green bit 8
Bit 16—Blue bit 1
Bit 17—Blue bit 2
Bit 18—Blue bit 3
Bit 19—Blue bit 4
Bit 20—Blue bit 5
Bit 21—Blue bit 6
Bit 22—Blue bit 7
Bit 23—Blue bit 8
and the desired output bit mapping, each input to a unique output, is to be as follows:
Bit 0—Green bit 1
Bit 1—Green bit 2
Bit 2—Green bit 3
Bit 3—Green bit 4
Bit 4—Green bit 5
Bit 5—Green bit 6
Bit 6—Green bit 7
Bit 7—Green bit 8
Bit 8—Blue bit 1
Bit 9—Blue bit 2
Bit 10—Blue bit 3
Bit 11—Blue bit 4
Bit 12—Blue bit 5
Bit 13—Blue bit 6
Bit 14—Blue bit 7
Bit 15—Blue bit 8
Bit 16—Red bit 1
Bit 17—Red bit 2
Bit 18—Red bit 3
Bit 19—Red bit 4
Bit 20—Red bit 5
Bit 21—Red bit 6
Bit 22—Red bit 7
Bit 23—Red bit 8
Then, in accordance with equations (1) above the values of S[i] are as follows:
S0=8
S1=9
S2=10
S3=11
S4=12
S5=13
S6=14
S7=15
S8=16
S9=17
S10=18
S11=19
S12=20
S13=21
S14=22
S15=23
S16=0
S17=1
S18=2
S19=3
S20=4
S21=5
S22=6
S23=7

The information is shown in a tabular form in FIG. 2.

Figure 3:
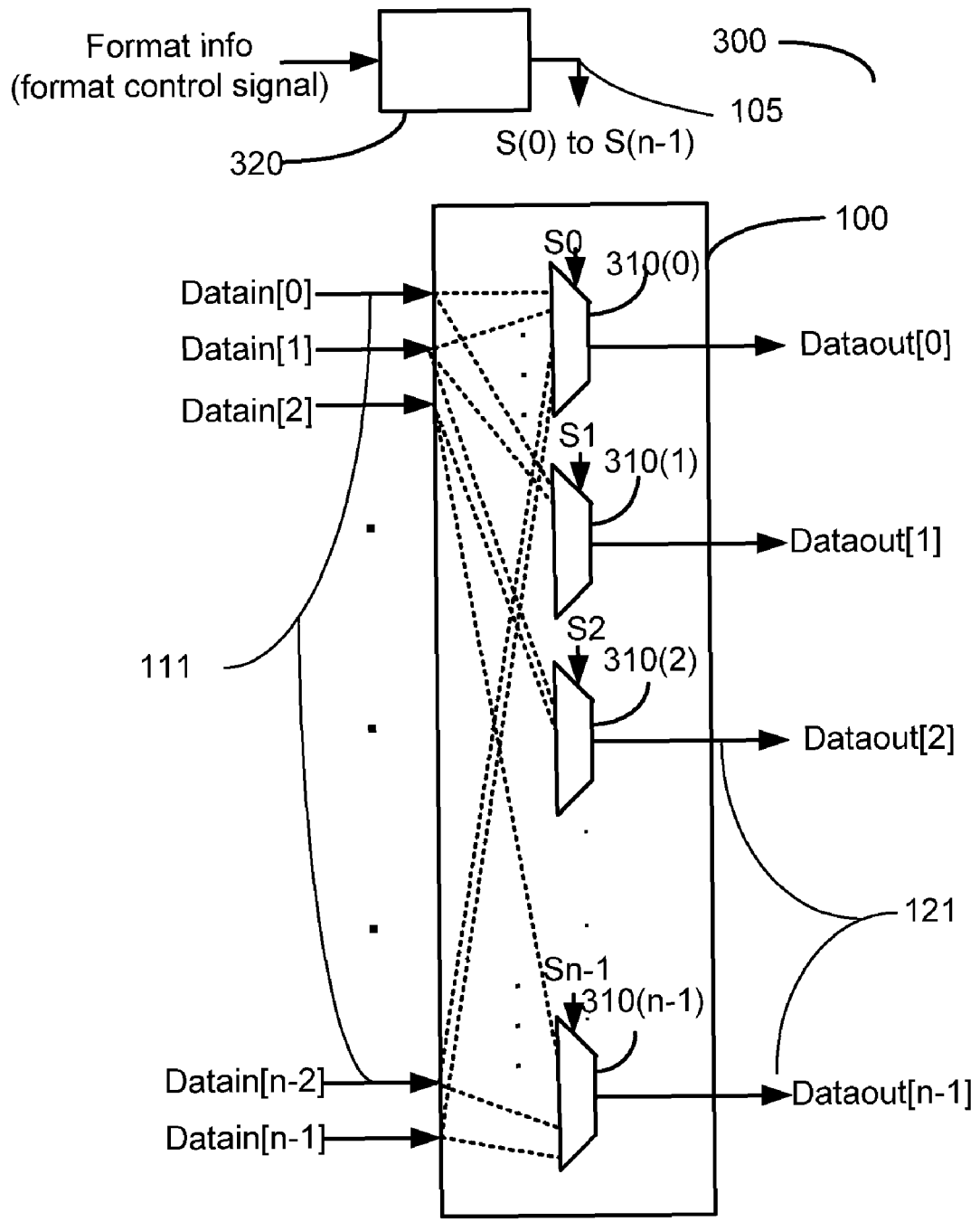
FIG. 3 is a structural diagram of an "n" input to "n" output video pixel mapping matrix.

FIG. 3 is an exemplary and non-limiting block diagram 300 of a 'n' input 111, datain[0] to datain [n−1], and 'n' output 121, dataout[0] to dataout[n−1] of mapping matrix 100. Each block comprise of 'n' n-to-1 multiplexers 310(0) to 310(n−1). Each multiplexer 310 is associated with a corresponding select signal S [i], which decodes which input gets to be connected to which output as explained in more detail above. For each pixel format mapping configuration there will be one and only one non-repeating select signal value S[i] associated with each multiplexer. This ensures that only one input signal gets connected to an output. The select signals may be provided by a control unit 320 that generates the desired select signals. By providing a mapping of the 'n' inputs to the 'n' outputs according to the specific select input signal values, the mapping matrix 100 can change the input video pixel format to any desired output pixel format. The control unit 320 may be preprogrammed with currently known mapping schemes. The selection of a specific conversion would result in the use of the appropriate select signals, for example those shown in FIG. 2. The out put of the control unit 320 is also shown in example in FIG. 3 as select signals S(0) to S(n−1). The control unit 320 is designed so that a no two inputs may be simultaneously connected through the multiplexers to a single output.

Figure 4:
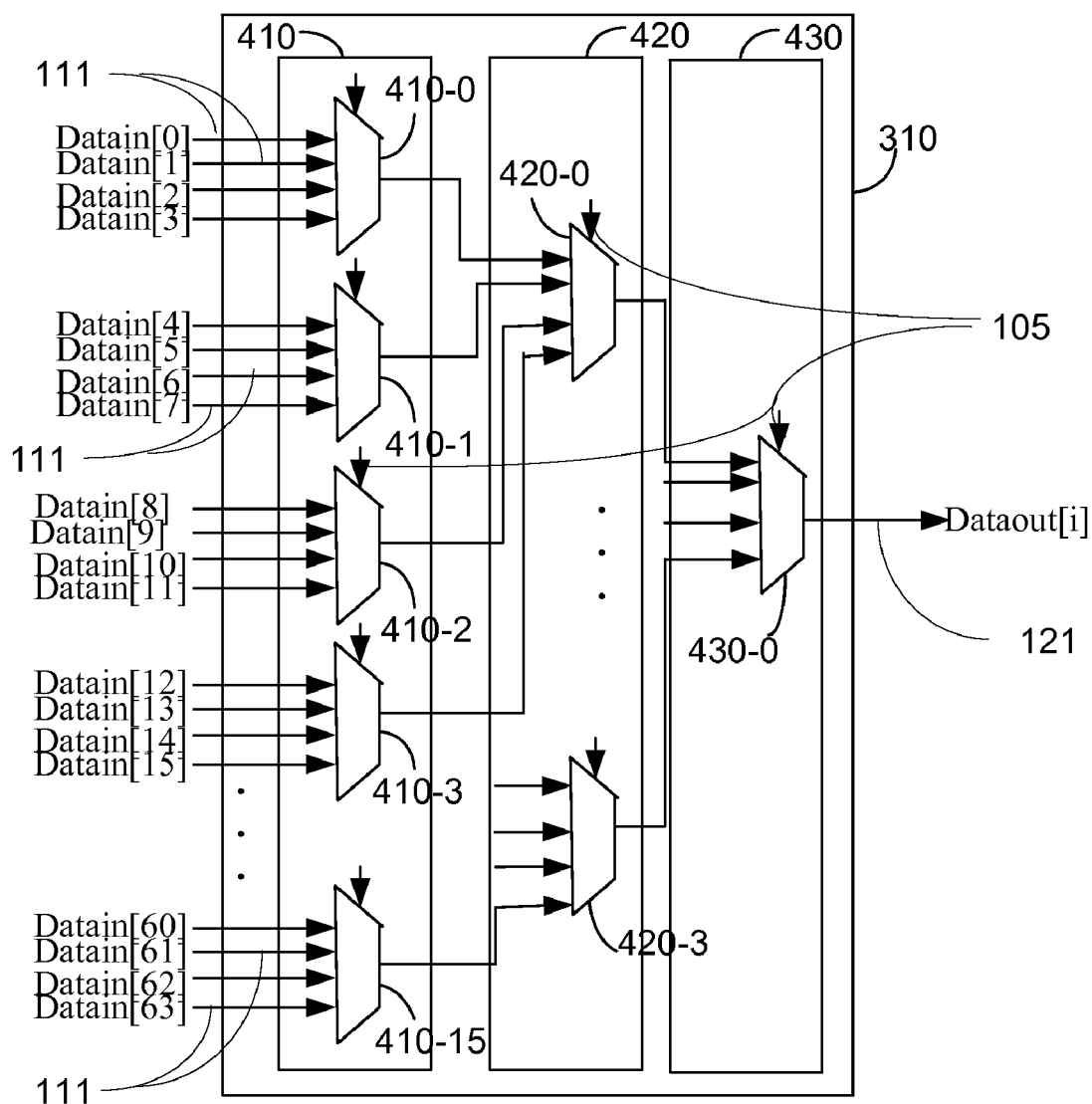
FIG. 4 is a hierarchical implementation of a multiplexer using a plurality of smaller multiplexers.

FIG. 4 shows a hierarchical implementation of a multiplexer 310 from a plurality of smaller multiplexers, i.e., multiplexers having a lesser number of inputs, and enabled in accordance with the disclosed invention. In this exemplary and non-limiting implementation, the path of a single output signal in a 64×64 mapping matrix is implemented by 64 multiplexers 310. Each of the 64-to-1 multiplexers 310, can be comprised of three levels of hierarchy, 410, 420 and 430 using 4-input multiplexers as shown in FIG. 4. The first hierarchy level 410 is comprised of sixteen 4-input multiplexers 410-0 to 410-15. There are hence 64 inputs into this multiplexer 310 at the first hierarchy level, one from each input, i.e., input[0] to input [63]. The selected outputs of the 16 multiplexers of hierarchy level 410 are fed into the second hierarchy level 420 where there are four 4-input multiplexers 420-0 to 420-3. The outputs from the second hierarchy level 420 are fed into a single 4-input multiplexer 430-0 that comprises the third hierarchical level 430. The third hierarchy level 430 has a single output signal that is connected to the designated output of multiplexer 310. The 64-to-1 multiplexer uses the decoded select signal S[i] as input into each of the 4-input multiplexers of multiplexer 310 for selection of the path from input to output.

The use of this simple configurable mapping matrix scheme for mapping data from one video format to another will greatly reduce the need for dedicated video transmission or reception. It will help make the systems compatible with one another, irrespective of the formats used. This will also help to map old formats to new formats and vice versa, allowing use of older transmissions to be viewed on new display devices and new transmissions to be viewed on older display devices. This will reduce the hardship to the consumer in requiring new display devices every time new formats are introduced. In a typical implementation, this mapping matrix can be a stand alone IC, or be integrated as a part of an IC used for handling video data.

The use of the configurable mapping matrix for video format mapping will reduce the need for the equipment manufacturers to have a number of versions of dedicated display equipment, each covering at best a limited number of formats. The use of the mapping matrix, implemented as part of a video handling IC, to convert any system for use with any available format is disclosed. This will enable reduction of the number of system types and reduce the cost of inventory and stocking. On a chip level manufacturing of the IC, a standard chip set that is configurable will be able to take advantage of the economy of scale that will be available to improve profitability and reduce costs. Even though the disclosure is for a hardware implementation, it is not limiting and the inventions herein may be implemented in hardware, software, firmware or any combination thereof.

Thus the present invention introduces the concept of using a configurable mapping matrix for mapping data from one format to another in the Video field-unique solution for the industry. The invention will allow the mapping from any of the old formats to new formats as new formats arise as long as the number of Video bits is limited to N, currently 36 in the present implementation. The idea of the expandable mapping matrix for the above purpose makes the future conversion mapping matrix development simple and easy. In addition, there is a cost advantage for equipment manufacturers in using such a mapping matrix, allowing reconfiguration between old and/or new formats as required. There is also a cost reduction of the chip due to economy of scale.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An apparatus for converting video pixel data from a first component video format to a second component video format, the apparatus comprising:

a mapping matrix having a plurality of inputs and a plurality of outputs, the number of said plurality of inputs being equal to the number of said plurality of outputs;

the mapping matrix having a plurality of multiplexers, each of the plurality of multiplexers having a number of outputs equal to the number of outputs to the mapping matrix and a number of inputs equal to the number of inputs to the mapping matrix, each of the plurality of multiplexers being implemented using a plurality of smaller multiplexers connected hierarchically, each multiplexer decoding a selection signal provided to the each of the plurality of multiplexers to provide the selection signals for the plurality of smaller multiplexers;

a plurality of selection signals coupled to the mapping matrix, each of said plurality of selection signals enabled to activate a path between an input of said mapping matrix to an output of said mapping matrix; and a control unit enabled to generate said plurality of selection signals to allow the mapping of each of said plurality of inputs to each of said plurality of outputs without simultaneously mapping any two of said plurality of inputs to any single output of the said plurality of outputs, wherein the plurality of inputs receive video pixel data in the first component video format and the plurality of outputs output video pixel data in the component second video format, the apparatus enabling the conversion of the first component video format to the second component video format, wherein the first component video format is different from the second component video format, said first and second component video formats being high definition multimedia formats connected through a high definition multimedia interface (HDMI), the control unit being preconfigured to perform any of a plurality of different component video format conversions;

the apparatus consisting of at least a portion of an integrated circuit.

2. A method for converting video signals in a first component video format to a second component video format using a mapping matrix, the mapping matrix having a plurality of multiplexers, each of the plurality of multiplexers having a number of outputs equal to the number of outputs to the mapping matrix and a number of inputs equal to the number of inputs to the mapping matrix, each of the plurality of multiplexers being implemented using a plurality of smaller multiplexers connected hierarchically, each multiplexer decoding a selection signal provided to the each of the plurality of multiplexers to provide the selection signals for the plurality of smaller multiplexers;

the method comprising:

inputting video signals in any one of a plurality of component video formats to the mapping matrix, the number of inputs to the mapping matrix being equal to the number of outputs from the mapping matrix wherein any one of the inputs of the mapping matrix may be connected to any one output of said mapping matrix; and applying a plurality of selection signals to the mapping matrix wherein said plurality of selection signals are enabled to prevent simultaneously connecting two inputs to said mapping matrix to a single output of said mapping matrix, the selection signals being operative to enable paths in the mapping matrix that cause video signals being outputted from the mapping matrix to be in any other one of said plurality of component video formats that are high definition multimedia formats connected through a high definition multimedia interface (HDMI), wherein the first component video format is different from the second component video format;

the method being practiced in an integrated circuit.

* * * * *